(12) United States Patent
Brofman et al.

(10) Patent No.: US 6,878,608 B2
(45) Date of Patent: Apr. 12, 2005

(54) METHOD OF MANUFACTURE OF SILICON BASED PACKAGE

(75) Inventors: Peter J. Brofman, Hopewell Junction, NY (US); Glenn G. Daves, Beacon, NY (US); Sudipta K. Ray, Wappingers Falls, NY (US); Herbert I. Stoller, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 314 days.

(21) Appl. No.: 09/870,531

(22) Filed: May 31, 2001

(65) Prior Publication Data

US 2002/0180013 A1 Dec. 5, 2002

(51) Int. Cl.$^7$ .................. H01L 21/46; H01L 21/30; H01L 21/4763; H01L 21/44; H01L 21/302
(52) U.S. Cl. ............... 438/459; 438/455; 438/464; 438/458; 438/637; 438/639; 438/672; 438/689
(58) Field of Search ................. 438/464, 639, 438/672, 458, 459, 455, 689, 637, 977, 106, 108, FOR 160, FOR 340, 668, 691, 706, FOR 385, FOR 403

(56) References Cited

U.S. PATENT DOCUMENTS

| | | | |
|---|---|---|---|
| 5,258,236 A | | 11/1993 | Arjavalingam et al. ...... 428/626 |
| 5,286,671 A | * | 2/1994 | Kurtz et al. .................. 438/50 |
| 5,497,545 A | | 3/1996 | Watanabe et al. ............ 29/830 |
| 5,552,345 A | * | 9/1996 | Schrantz et al. ............ 438/460 |
| 5,593,917 A | * | 1/1997 | Nuyen ......................... 438/28 |
| 5,654,590 A | | 8/1997 | Kuramochi ................. 257/778 |
| 5,965,933 A | | 10/1999 | Young et al. ............... 257/621 |
| 5,973,257 A | * | 10/1999 | Cantarini et al. ........... 136/249 |
| 6,036,809 A | | 3/2000 | Kelly et al. ................. 156/247 |
| 6,040,235 A | * | 3/2000 | Badehi ........................ 438/464 |
| 6,066,562 A | | 5/2000 | Oshima et al. ............. 438/691 |
| 6,124,179 A | * | 9/2000 | Adamic, Jr. ................ 438/309 |
| 6,184,060 B1 | | 2/2001 | Siniaguine .................. 438/106 |
| 6,187,418 B1 | | 2/2001 | Fasano et al. .............. 428/210 |
| 6,267,905 B1 | * | 7/2001 | Silverbrook ................. 216/27 |
| 6,287,940 B1 | * | 9/2001 | Cole et al. .................. 438/455 |
| 6,294,439 B1 | * | 9/2001 | Sasaki et al. ............... 438/464 |
| 6,333,208 B1 | * | 12/2001 | Li .............................. 438/107 |
| 6,425,971 B1 | * | 7/2002 | Silverbrook ................. 156/230 |
| 6,506,620 B1 | * | 1/2003 | Scharf et al. ................ 438/52 |
| 6,557,977 B1 | * | 5/2003 | Silverbrook ................. 347/54 |
| 2002/0086519 A1 | * | 7/2002 | Houston et al. ............. 438/622 |

FOREIGN PATENT DOCUMENTS

JP         403293747      * 12/1991

OTHER PUBLICATIONS

Matsuo et al., "Silicon Interposer Technology for High–density Package", Session 36, Afternoon, Wednesday, May 24, 2000, at Caesar's Palace, Las Vegas, NV, Proceedings of IEEE Electronic Components and Technology Conference, IEEE, ISBN 0780359089, 4 pages, 2000.

* cited by examiner

Primary Examiner—Kamand Cuneo
Assistant Examiner—James M. Mitchell
(74) Attorney, Agent, or Firm—Graham S. Jones, II; Ira D. Blecker

(57) ABSTRACT

A silicon based package (SBP) is formed starting with a thick wafer, which serves as the base for the SBP, composed of silicon which has a first surface and a reverse surface which are planar. Then form an interconnection structure including multilayer conductor patterns over the first surface. Form a temporary bond between the SBP and a wafer holder, with the wafer holder being a rigid structure. Thin the wafer to a desired thickness to form an Ultra Thin Silicon Wafer (UTSW) for the SBP. Forming via holes which extend through the UTSW, forming metallization in the via holes which extends through the UTSW, making electrical contact to the interconnection structure on the first surface. Then bond the metallization in the via holes to pads of a carrier.

16 Claims, 15 Drawing Sheets

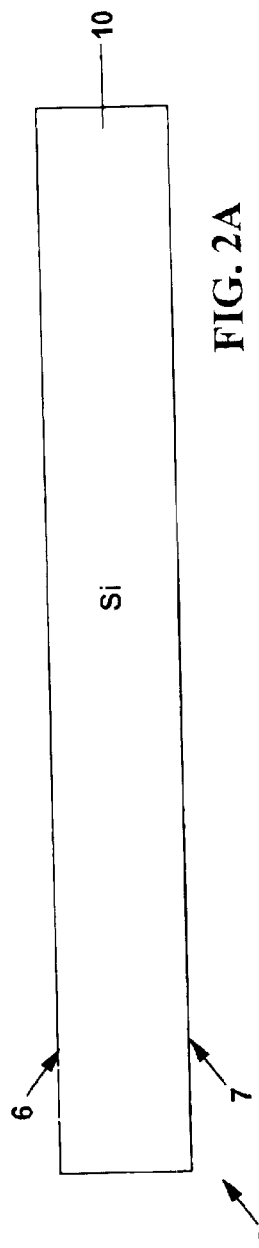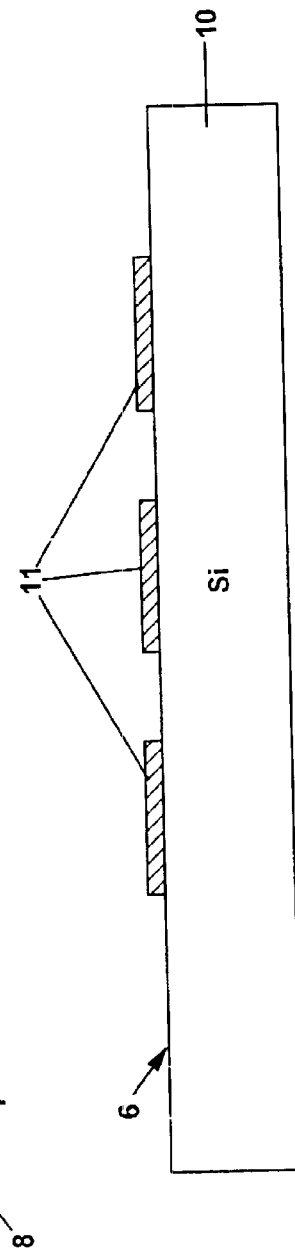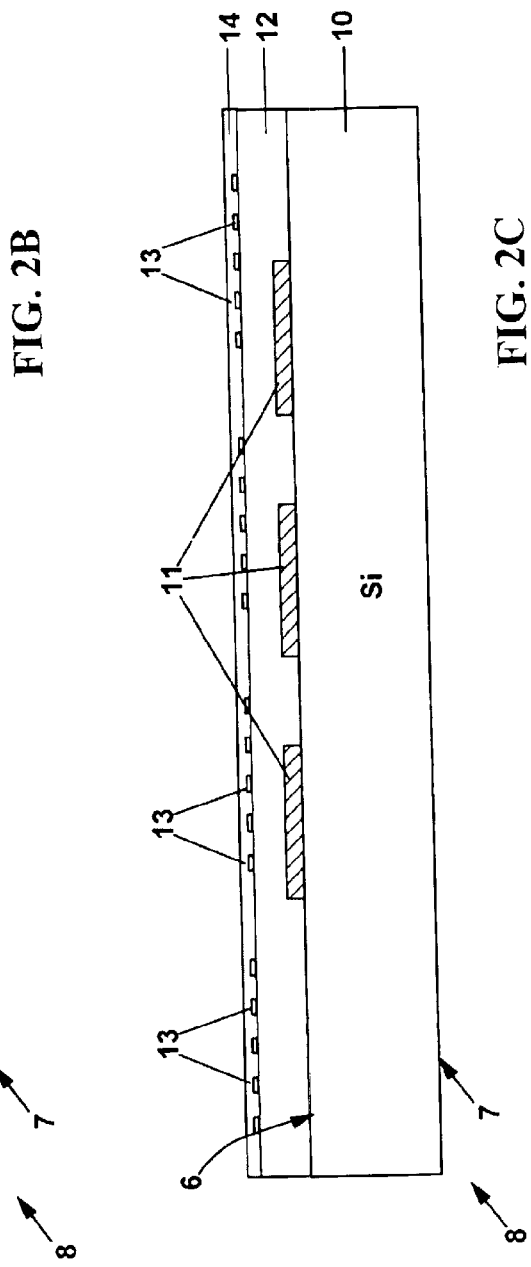

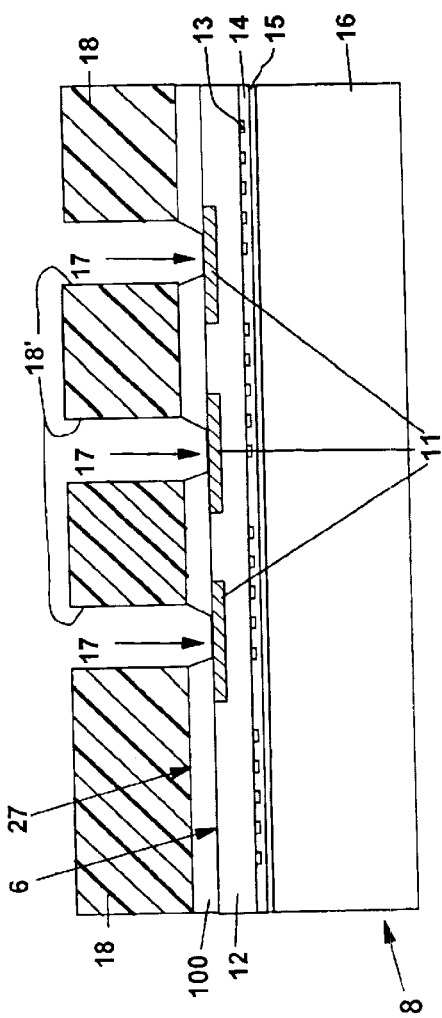
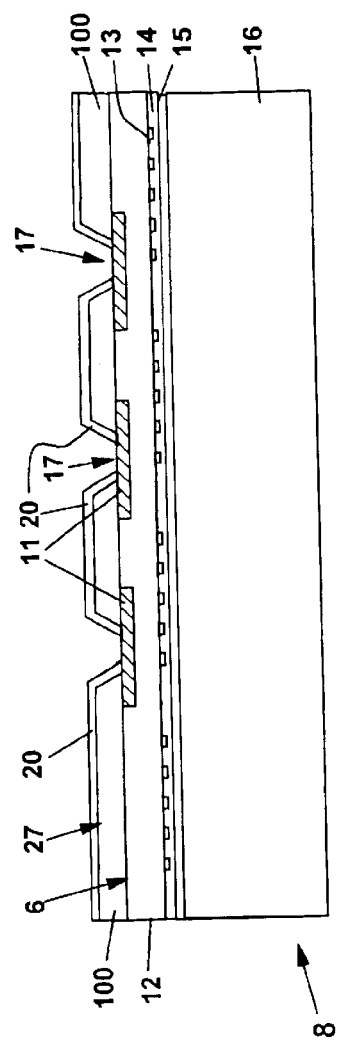
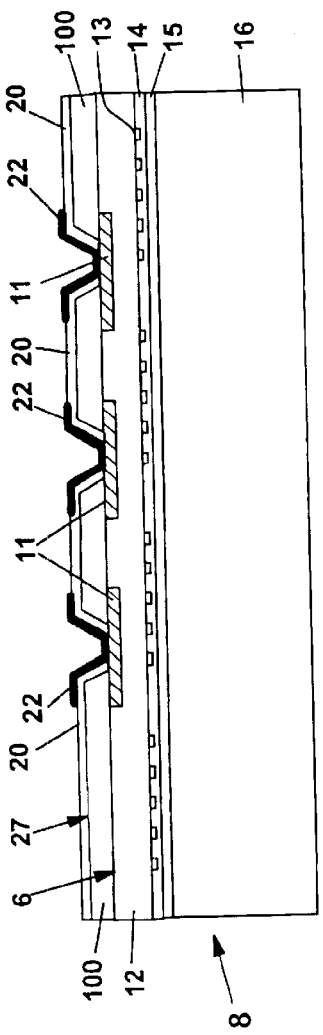
FIG. 2F
FIG. 2G
FIG. 2H

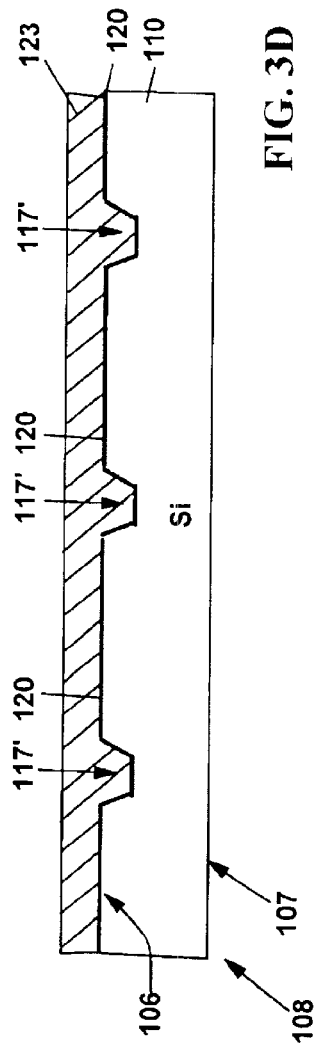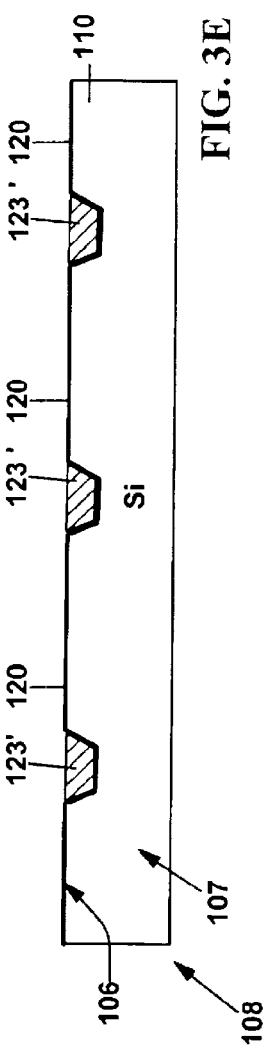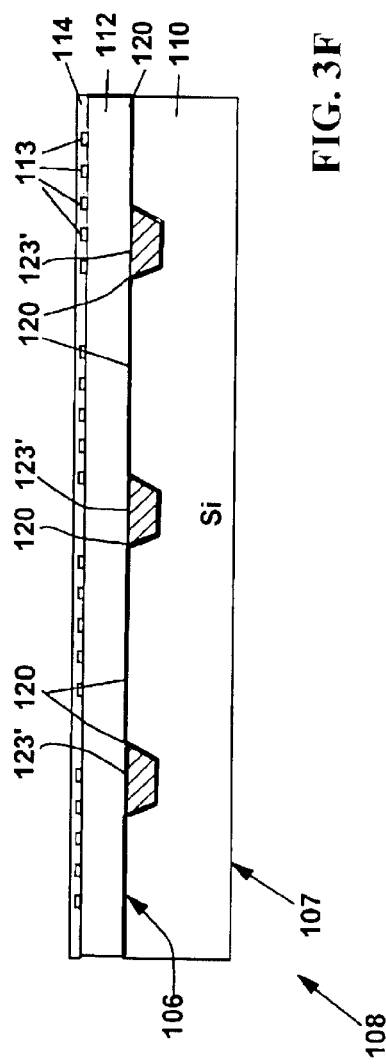

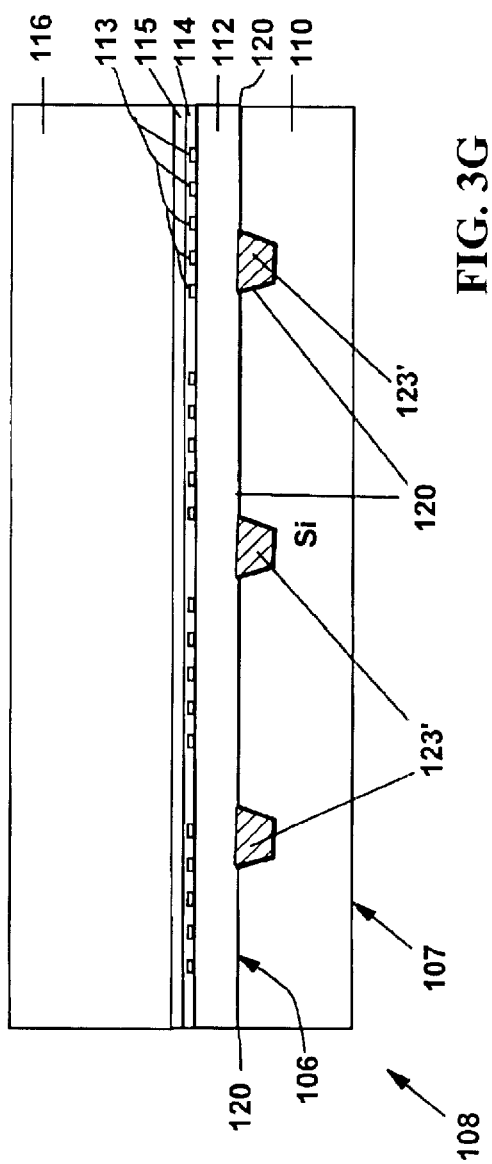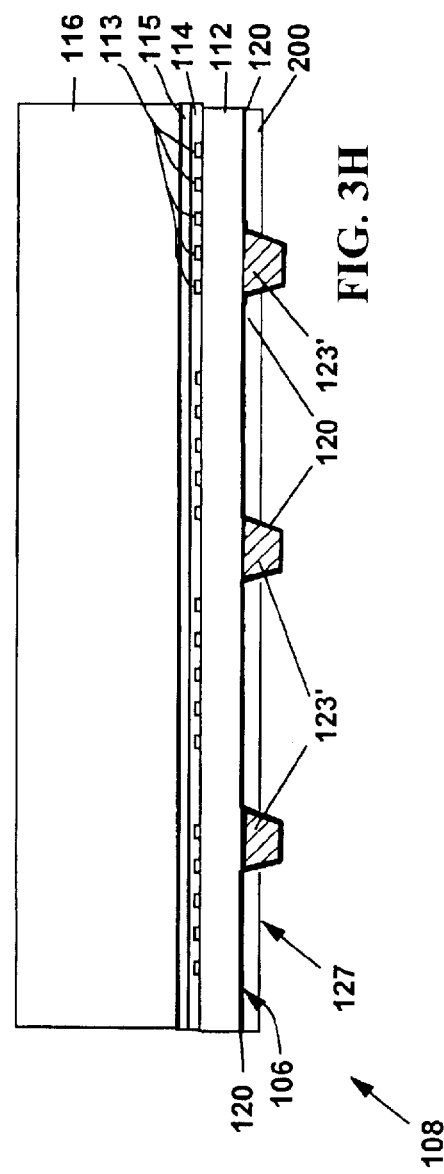

# METHOD OF MANUFACTURE OF SILICON BASED PACKAGE

BACKGROUND OF THE INVENTION

1. Field of the Invention

This invention relates to semiconductor devices and more particularly to a method of manufacturing semiconductor packaging.

2. Description of Related Art

U.S. Pat. No. 5,497,545 of Watanabe et al. for "Method of Making Electrical Connections in the Manufacture of Wiring Sheet Assemblies" describes a multilayer conductor stack formed on a polyimide or ceramic carrier having first and second conductor separated by an insulator sheet are electrically interconnected by a stud inserted through a hole formed in the second conductor and the insulator sheet. Wire bonding and stamping secure the stud to the conductors, thereby forming an electrical connection.

U.S. Pat. No. 5,654,590 of Kuramochi for "Multichip-Module Having an HDI and a Temporary Supporting Substrate" starts with a bonding layer composed of a material such as silicon, aluminum or epoxy resin formed over a temporary supporting base with a temporary supporting layer composed of a material such as $SiO_2$ or various glasses. Then an insulating layer is formed over the bonding layer with throughholes. Next a copper interconnection layer is formed and patterned lithographically. Several alternate insulating layers and interconnection layers with coaxial throughholes are formed. The interconnection layers are also connected by vias. The resulting chip supporting substrate is then separated from the temporary supporting base by etching away the temporary supporting layer of $SiO_2$ or glass with an etchant such as HF, $NH_4F$ or a mixture of $NH_4F$ and $H_3PO_4$. Butyl acetate and acetone are suggested to etch away the epoxy resin.

U.S. Pat. No. 5,965,933 of Young et al. for "Semiconductor Packaging Apparatus" starts the process of manufacture with a thick silicon wafer in which microelectronic devices are to be formed in a device area. Contact cavities have been etched in the top surface of the thick wafer in a pattern surrounding the device area. The contact cavities are filled with via pads composed of refractory metal such as titanium, titanium tungsten or a silicide. Then a semiconductor device is formed in the device area and interconnnects are formed along with an intermediate dielectric layer which is formed above the entire thick silicon wafer including the device, the interconnects and the vias. A cover wafer formed of a semiconductor such as silicon is formed over the intermediate dielectric layer and bonded to the thick silicon wafer. Then the thick silicon wafer is thinned by removing material from the bottom surface thereof until the bottom surfaces of the vias are exposed. Conventional bump contacts are formed on the bottom surfaces of the vias. Alternatively, there is the possibility of forming the vias in the cover wafer instead of the thick silicon wafer by preforming vias in holes in the cover wafer, followed by bonding the cover wafer over the intermediate dielectric layer, the interconnect and the thick silicon wafer. Then the cover wafer is thinned to open the via holes, etc. Next the via holes are filled with metal and bump contacts are formed over the metal vias.

U.S. Pat. No. 6,184,060 of Siniaguine for "Integrated Circuits and Methods for Their Fabrication" describes formation of vias and contact pads on the back side of a silicon semiconductor chip. The vias and contact pads are formed by the process starting with forming tapered vias (openings) in the back of a workpiece comprising a silicon wafer by with an isotropic plasma etch of the via opening down into the silicon wafer through an aluminum or photoresist mask formed over the silicon. The via openings have a depth at least as large as the final thickness of the wafer after the manufacturing process is completed. After the mask is removed, a thin conformal, glass or BPSG dielectric layer (1–2 $\mu$m thick) is formed over the substrate including the vias. Then a thin conformal blanket conductive layer (e.g. 0.8–1.2 $\mu$m thick) is formed over the dielectric layer of aluminum, gold or nickel. A planar glass layer is spun onto the surface of the conductive layer to fill the vias to provide a planar top surface of the wafer. The conductive layer may or may not have been patterned before the last step of filling the vias with the planar glass layer. Other layers to be a part of the device structure are then formed on top of the planarized surface of the workpiece including a dielectric layer and contact pads. Then the back side of the silicon wafer is etched by an atmospheric plasma etch with argon and carbon tetrafluoride in air. When the glass or BPSG dielectric layer becomes exposed, the silicon substrate is preferentially etched relative to the silicon dioxide dielectric layer by almost an order of magnitude difference with the silicon etching far more quickly. Thus, the portions of the lower surface (back side) of the conductive layer formed in the via openings comprise contact pads for the back side of the chip which are exposed by the preferential etching away of the silicon.

U.S. Pat. No. 5,258,235 of Arjavalingam et al. for "Multilayer Thin Film Structure and Parallel Process in Method for Fabricating Same" describes releasing a structure from a substrate by a laser ablation shining a laser beam through the substrate to ablate the polyimide film. The result is that the polyimide film releases the structure.

Matsuo et al. "Silicon Interposer Technology for High-density Package" Electronic Components and Technology Conference, IEEE, 4 pages (2000) describes a fabrication process in which through hole 30 $\mu$m in diameter and 60 $\mu$m deep was etched anisotropically by a "high-speed RIE process" resulting in a hole with nearly vertical sidewalls. After coating the wafer with silicon dioxide, the through hole was filled with Cu by electroplating onto a Cu/TaN seed layer. After many intervening steps, the wafer was thinned until exposing the through plug by BSG. The vertical sidewalls of the through hole may present a problem with regard to the mechanical integrity of the ultimate thin wafer because of stresses generated by the mismatch of the characteristics of the silicon and the copper. Such thin wafers with inherent stresses may be difficult to handle through normal handling during the fabrication of multilevel wiring processes.

One of the problems with using silicon based structures for electronic packaging applications is to be able to provide a highly reliable product by employing an efficient method of forming vias through a membrane thin silicon substrate, i.e. from the bottom surface through the silicon to the top of the silicon where the wiring structure is fabricated. That requires forming the vias without breaking the fragile membrane thin wafer and yet performing the task with a highly competitive manufacturing cost.

See U.S. Pat. No. 6,036,809 of Kelly et al. and U.S. Pat. No. 6,066,562 of Ohshima et al.

SUMMARY OF THE INVENTION

A problem with using silicon based structures for electronic packaging applications is the need for getting vias through the silicon, i.e. from the bottom surface through the silicon to the top of the silicon where the wiring structure is fabricated. This invention solves the above problem by some or all of the techniques as follows:

a) using a wafer thinning process to create a silicon structure thin enough for 'reasonable sized' vias to be created;
b) forming unique structures comprising capture pads as the first level of metal placed on the silicon surface to prepare for creation of the vias, with the capture pads serving as a natural etch stop, allowing creation of the vias without requiring extremely precise etch control or without pre-etching and filling vias by a conventional via filling process;
c) using a sacrificial glass plate as a holder to facilitate handling of ultra thin silicon wafers; and/or
d) minimizing the number of through vias required in the combined silicon/carrier structure, which enables the use of large reliable vias to be utilized.

This invention provides a structure, and a process for creating said structure, for a silicon based electronic package combining an ultra-thin silicon substrate with a suitable carrier such as an MLC (Multi-Layer Ceramic) substrate in such a combination that the through vias needed are minimized.

An advantage of this invention is the ability to support very high wiring density packaging applications while using the low cost silicon based processing technology.

In accordance with this invention, a Silicon Based Package (SBP) is manufactured starting with a standard silicon wafer. The wafer is then attached to a temporary, transparent, glass wafer holder and a wafer thinning process such as atmospheric plasma etching or a CMP process is employed to thin the wafer to a thickness in the range from about 50 μm to about 75 μm from an original thickness of about 750 μm. We will form a single or a multiplicity of wiring structures on each wafer.

In a first aspect of this invention the process steps are performed in the sequence as follows:
1. Start with a standard silicon wafer.
2. Form capture pads on the wafer surface (prior to thinning).
3. Form a BEOL structure (including multilayer conductor patterns and C4 pads) over the surface including the C4 pads.
4. Form a temporary bond of a temporary, transparent, glass wafer holder to the silicon wafer using a releasable adhesive.
5. Thin the silicon wafer to a desired thickness in the range from about 50 im to about 75 μm to form a UTSW for the SBP.
6. Form a mask and etch via holes through the back of the thinned wafer, with the capture pads serving as etch stops.
7. Deposit a blanket silicon oxide layer and then remove the portions thereof at the bottoms of the via holes exposing surfaces of the capture pads.
8. Deposit and pattern Ball Limiting Metallurgy (BLM), in contact with the capture pads.
9. Form micro-BGAs on the BLM.
10. Dice the structure (wafer and holder) to form individual wiring structures from the multiplicity of structures formed on the wafer holder.
11. Provide a ceramic carrier with through vias and via pads in an array pattern matching the array pattern of the etched vias and the micro-BGAs.
12. Join micro-BGAs on the SBP to the via pads on the ceramic carrier.
13. Remove the temporary, transparent, glass wafer holder.
14. Make openings to C4 pads on surface of BEOL structure
15. Join chips to the upper surface pads provided on the multilayer conductor member.

In a second aspect of this invention the process steps are performed in the sequence as follows:
1. Start with a standard silicon wafer.
2. Form shallow via holes about 80 μm–100 μm deep in the wafer surface.
3. Deposit a blanket dielectric layer which isolates the front surface of the silicon wafer and covers the sidewalls of the vias.
4. Deposit a blanket metal via/cap layer covering and filling the via holes.
5. Polish back to the dielectric layer leaving metal vias filling the via holes.
6. Apply multilayer, insulated conductor patterns on the polished surface of the silicon wafer.
7. Form a temporary bond of a temporary, transparent, glass wafer holder to the silicon wafer.
8. Thin the silicon wafer to desired thickness in the range from about 50 μm to about 75 μm to form a UTSW. This will expose the metal vias on the back side of the UTSW.
9. Deposit and pattern Bottom Layer Metallurgy (BLM).
10. Form the micro-BGA's on the BLM.
11. Dice the structure to form individual wiring structures from the multiplicity of structures formed on the wafer holder.
12. Provide ceramic carrier with through vias with a pattern matching that of the etched vias.
13. Join micro-BGAs to the ceramic carrier vias.
14. Remove temporary, transparent, glass wafer holder.
15. Join chips to the upper surface pads provided on the multilayer conductor member.

BRIEF DESCRIPTION OF THE DRAWINGS

The foregoing and other aspects and advantages of this invention are explained and described below with reference to the accompanying drawings, in which:

FIGS. 2A–2M are schematic sectional diagrams of the process flow for forming an SBP in accordance with the sequence of steps of a first process flow.

FIGS. 3A–3M are schematic sectional diagrams of the process flow for forming an SBP in accordance with the sequence of steps of a second process flow.

DESCRIPTION OF THE PREFERRED EMBODIMENTS

Figure 1:
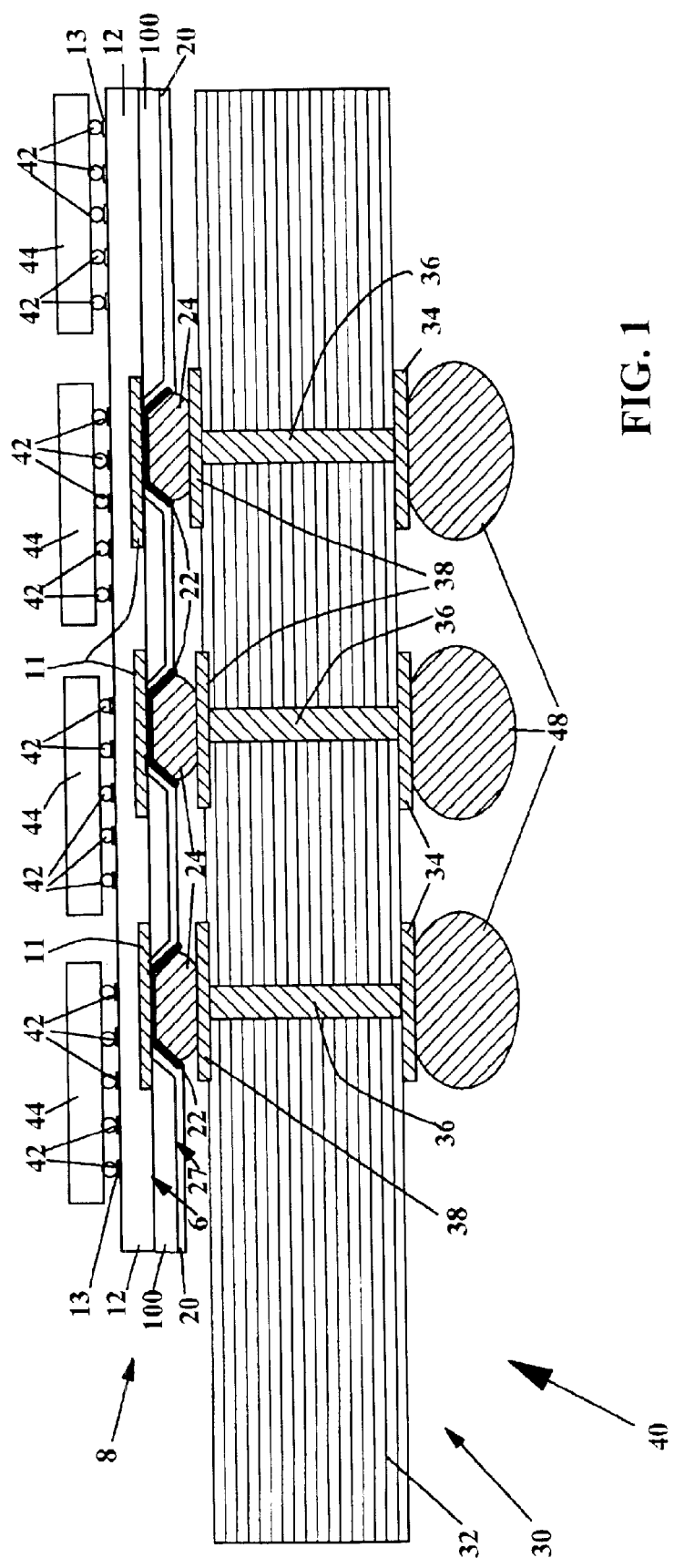
FIG. 1 is a schematic sectional diagram of a combined package including a Silicon Based Package (SBP) mounted on a package carrier manufactured employing a process in accordance with this invention, the steps of which are illustrated by FIGS. 2A–2M.

FIG. 1 is a schematic sectional diagram of an embodiment of a combined package 40 including a Silicon Based Package (SBP) 8 mounted on a multilayer ceramic package carrier 30 in accordance with this invention. The steps of a method for forming a package of the kind shown in FIG. 1 are illustrated by FIGS. 2A–2M. Package 8 includes an Ultra-Thin Silicon Wafer (UTSW) 100 with a planar upper surface 6 and a planar lower surface 27 covered, on the lower surface thereof, with a dielectric material 20. An array of vias 22 have been formed extending through openings through the dielectric material 20 and the UTSW 100 to the top surface 6 thereof. Micro-BGAs 24 have been formed joined to the array of conductive UTSW vias 22 extending from the top surface 6 through to the lower surface 27 of the UTSW 100. Above each UTSW via 22 is a metal capture pad 11, each of which served as an etch stop when the holes in which the UTSW vias 22 are located were being formed. The upper surface of the UTSW 100 and the upper surfaces of the capture pads 11 are covered with a standard silicon BEOL (Back End Of the Line) structure 12. C4 contact pads 13 are formed arrayed on the top surface of the BEOL structure 12 to which chips 44 with C4 solder balls 42 are joined. The C4 solder balls 42 support semiconductor chips 44 on the array of C4 contact pads 42.

The multilayer ceramic package carrier 30 includes a carrier body 32 in which a set of conductive, carrier vias 36 have been formed which are shown extending through the carrier body 32. As will be well understood by those skilled in the art, the carrier vias 36 are connected directly or indirectly (as a matter of design choice) from the top to the bottom through the carrier body 32, but for convenience of illustration, the carrier vias 36 are shown extending from the top to the bottom. The carrier vias 36 extend between a set of conductive Ball Grid Array (BGA) pads 38 (comprising a portion of the Top Surface Metallurgy (TSM) formed on the top surface of the carrier body 32) and bottom pads 34 (comprising a portion of the Bottom Surface Metallurgy (BSM) formed on the lower surface of the carrier body 32). Optional BGAs balls 48 of a BGA array are shown formed and bonded to the BGA pads 34. Preferably there is a substantial spacing separating the conductive, carrier vias 36 in the ceramic carrier body 32.

Process Flow 1—Silicon Based Packaging with Capture Pad

In this process flow, the capture pads 11 are formed during the early stages of the manufacture of a Silicon Based Package (SBP) 8.

FIG. 2A shows a silicon wafer 10 which is prepared for the process steps, in accordance with this invention. Preferably, the silicon wafer 10, which has a planar top surface 6 and a planar bottom surface 7, has the usual parameters with a typical diameter e.g. 6 inches, 8 inches, or 12 inches (15.24 cm, 20.32 cm, or 30.48 cm) and with a typical thickness such as 750 $\mu$m.

FIG. 2B shows the SBP 8 which comprises the silicon wafer 10 of FIG. 2A after an array of metal capture pads 11 (e.g. 600 $\mu$m diameter and spaced 400 $\mu$m apart) has been formed on the top surface 6 thereof. The first step in the process was to deposit a blanket metal film (not shown) which was then patterned by forming a photoresist mask (not shown) and etching to form the metal capture pads 11 in a layout which is compatible in its configuration with the configuration (shown in FIGS. 1 and 2I) of the micro-Ball Grid Array (micro-BGA) of balls 24.

FIG. 2C shows the SBP 8 of FIG. 2B after formation a standard silicon BEOL (Back End Of the Line) structure 12 comprising a multilevel dielectric and interconnection structure formed over the top surface 6 of silicon wafer 10 covering the capture pads 11 and covering exposed portions of the top surface of silicon wafer 10. The BEOL structure 12 is of the kind well known to those skilled in the art which provides electrical signal and power line interconnections (not shown for convenience of illustration) within the ultimate packaging structure shown in FIG. 1 to connect to the C4's 42 of chips 44 and any other devices supported on the packaging structure, as well as the capture pads 11.

An array of C4 pads 13, which are formed above the standard silicon multi-level BEOL structure 12, connect to wiring in the BEOL structure 12. The C4 pads 13 can be used to perform an electrical test for opens/shorts of all chip-to-chip nets (wiring).

Then, after the electrical testing step, the C4 pads 13 and the BEOL structure 12 are coated, as shown in FIG. 2C with a thin overcoat 14 preferably composed of polyimide to protect the structure during the intermediate steps of the process.

Figure 2D:
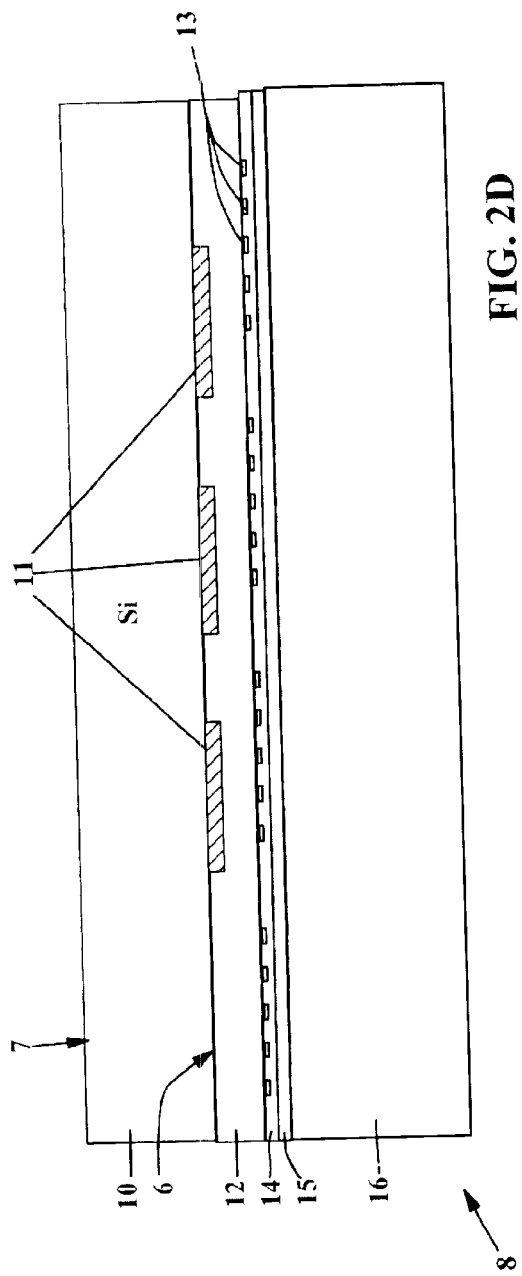

FIG. 2D shows the SBP 8 of FIG. 2C, which has been inverted, after joining the interconnection structure 12 (above the "top" surface 6 the silicon wafer 10) to a temporary, transparent, glass wafer holder 16, using a thin film 15 of a releasable adhesive such as polyimide. The SBP 8 and temporary, transparent, glass wafer holder 16 were inverted, after joining the SBP 8 to the temporary, transparent, glass wafer holder 16. The provision of the temporary, transparent, glass wafer holder 16 permits the normal handling of the SBP 8 instead of the extraordinary techniques that would be required if an ultra-thin wafer (in place of silicon wafer 10) were to be handled without the mechanical support of a temporary, transparent, glass wafer holder 16.

Figure 2E:
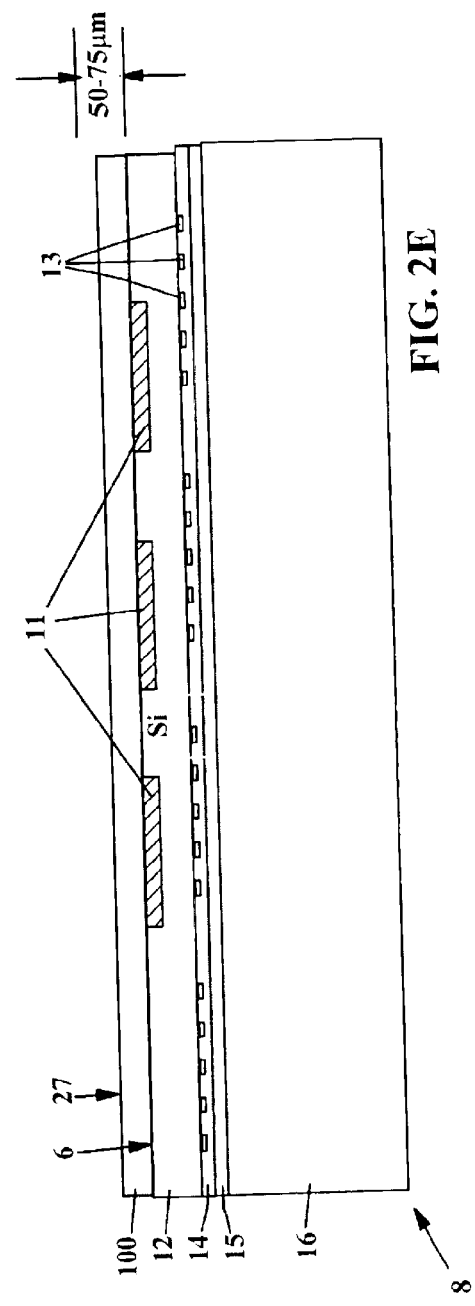

FIG. 2E shows the SBP 8 of FIG. 2D after the silicon wafer 10 has been thinned to form an Ultra-Thin Silicon Wafer (UTSW) 100 on the top of SBP 8. The silicon wafer 10 is thinned to the desired/appropriate thickness by a subtractive process. Preferably, the silicon wafer 10 is thinned by Chemical Mechanical Planarization/Polishing (CMP) processing. An alternative technique for thinning the silicon wafer 10 is plasma processing or the like.

As shown in FIG. 2E, the UTSW 100 has a thickness of about 50–75 $\mu$m from the "top" surface 6 to "bottom" surface 27. The thickness of silicon wafer 100 is reduced from the thickness of silicon wafer 10 which would conventionally be about 750 $\mu$m. Because silicon wafer 10 was joined to temporary, transparent, glass wafer holder 16 (FIG. 2D) before thinning, it is unnecessary to handle the UTSW 100/BEOL structure 12 with the C4 pads 13, etc. as a separate structure. Thus, the probability of damaging the thin UTSW 100 is minimized because of the structural support provided by the temporary, transparent, glass wafer holder 16.

FIG. 2F shows the SBP 8 of FIG. 2E with UTSW 100 covered with a temporary photoresist mask 18 formed above the inverted "bottom" surface 27 of the UTSW 100. Mask 18 is formed with an array of open via windows 18' therethrough which reach down through the "bottom" surface 27 of the thin UTSW 100 which is shown facing upwardly in FIG. 2F.

It is noted at this point that by thinning the silicon wafer 10, skipping for a moment to discuss FIG. 2H, a reasonable diameter via 22 can be created with conventional etching techniques without excessively weakening the UTSW 100. While it would seem that making the wafer 10 thinner would make it weaker, in fact without thinning, a very large diameter via would be needed requiring a larger plug, thus making the structure weaker because of Thermal Coefficient of Expansion (TCE) forces exerted by such a large plug which would expand more than a smaller plug.

The point here is that with a UTSW 100 with thickness of the order of 75 $\mu$m, one can create the via openings shown in FIG. 2F with a silicon wet etch process. Such a process typically will provide tapered vias with a 45 degree wall angle. So with a via pitch of 400 $\mu$m for the micro-BGA vias 22, the top and bottom via diameters will be 300 $\mu$m and 150 $\mu$m respectively for a 75 $\mu$m thick Si wafer. Without the support of the glass wafer holder 16, one might require wafers with thicknesses in the range of 200 $\mu$m or more to allow handling during the many process steps required to build the BEOL structure. The top diameter of the via opening 17 using the wet-etch technique described above will be 550 $\mu$m for a via bottom diameter of 150 $\mu$m. This will be greater than the via pitch, and all the vias will be shorted.

Alternately, much more expensive vertical-wall via formation and metal filling techniques will be required for wafers with thicknesses exceeding 150 μm. This is the key advantage of employing the UTSW coupled with a transparent glass wafer holder during BEOL processing.

Then using the access provided through the open windows 18', tapered via openings 17 have been etched through the thickness (e.g. 50–75 μm) of the UTSW 100 (with a silicon etchant) to expose surface areas of the top surfaces of the capture pads 11 which are located below the via windows 18' in alignment therewith. The capture pads 11 serve as etch stops during the etching through the UTSW 100, as will be well understood by those skilled in the art. Each of the via openings 17 is centered over a capture pad 11.

FIG. 2G shows the SBP 8 of FIG. 2F after removal of the mask 18, which was followed by deposition of a blanket dielectric material 20 (e.g. silicon oxide or polyimide) which isolates the upwardly facing "bottom" surface of the UTSW 100. Preferably, blanket, dielectric, isolation layer 20 comprises a CVD silicon oxide layer.

The silicon oxide isolation layer 20 covering the capture pads 11 is removed therefrom by etching. Preferably, the SBP 8 is coated with photoresist (not shown), which photoresist is then exposed to a pattern through a mask set. Then the photoresist is developed to expose the regions of the isolation layer 20 above the capture pads 11. Then exposed portions of the isolation layer 20 are removed by RIE (Reactive Ion Etching).

The result is that the silicon oxide isolation layer 20 covers all exposed surfaces of the silicon of the UTSW 100.

FIG. 2H shows the SBP 8 of FIG. 2G after formation of conventional BLM (Bottom Layer Metallurgy) metal via 22 over the dielectric isolation layer 20 by depositing and patterning BLM metallurgy for a micro-BGA (Ball Grid Array), as will be well understood by those skilled in the art. The BLM metal via 22 extends through the UTSW 100 and into contact with the exposed surfaces of the capture pads 11 and reaches over the layer 20 covering the sidewalls of the via holes 17 and extends around the periphery of the via holes 17. The BLM metal via 22 provides pads for the micro-BGA balls 24.

Figure 2I:
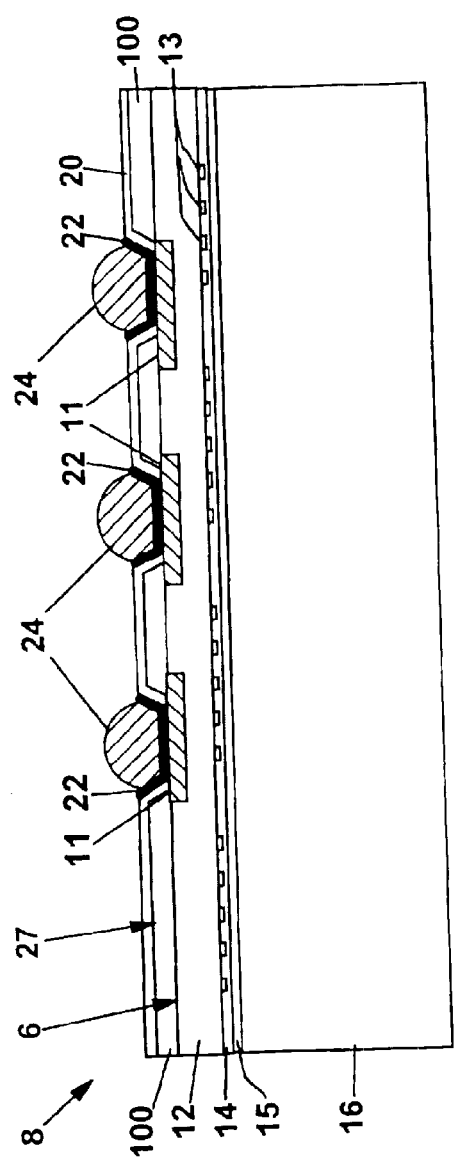

FIG. 2I shows the SBP 8 of FIG. 2H which has been completed by the formation of an array of micro-BGA balls 24 comprising a set of solder ball connectors which are bonded to the BLM layers 22 and which are thereby interconnected to the array of capture pads 11. The micro-BGA balls 24 are ready to be connected to the package carrier 30 shown in FIG. 1 and FIG. 2J. Thus, the micro-BGA balls 24 make contact with the capture pads 11 through the BLM metal vias 22 which extend through the thickness of the UTSW 100.

At this point, if it is required, the structure of the SBP 8 is diced to form individual wiring structures from the multiplicity of structures formed on the temporary, transparent, glass, wafer holder 16, as will be well understood by those skilled in the art.

Figure 2J:
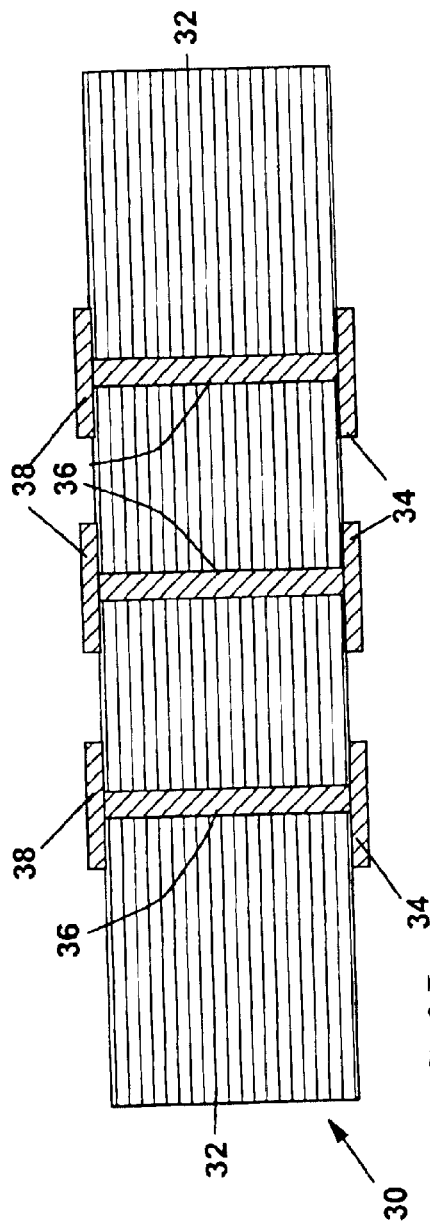

FIG. 2J shows a multilayer ceramic carrier 30 which has been built starting with a ceramic carrier body 32. There is a set of conductive carrier vias 36, a few of which are shown for purposes of illustration that extend through the carrier body 32 from the top to the bottom thereof.

The carrier vias 36 extend between a set of conductive Ball Grid Array (BGA) pads 38 (comprising a portion of the Top Surface Metallurgy (TSM) formed on the top surface of the carrier body 32) and a corresponding set of bottom pads 34 (comprising a portion of the Bottom Surface Metallurgy (BSM) formed on the lower surface of the carrier body 32).

Preferably there is a substantial spacing separating the conductive carrier vias 36 in the ceramic carrier body 32.

Figure 2K:
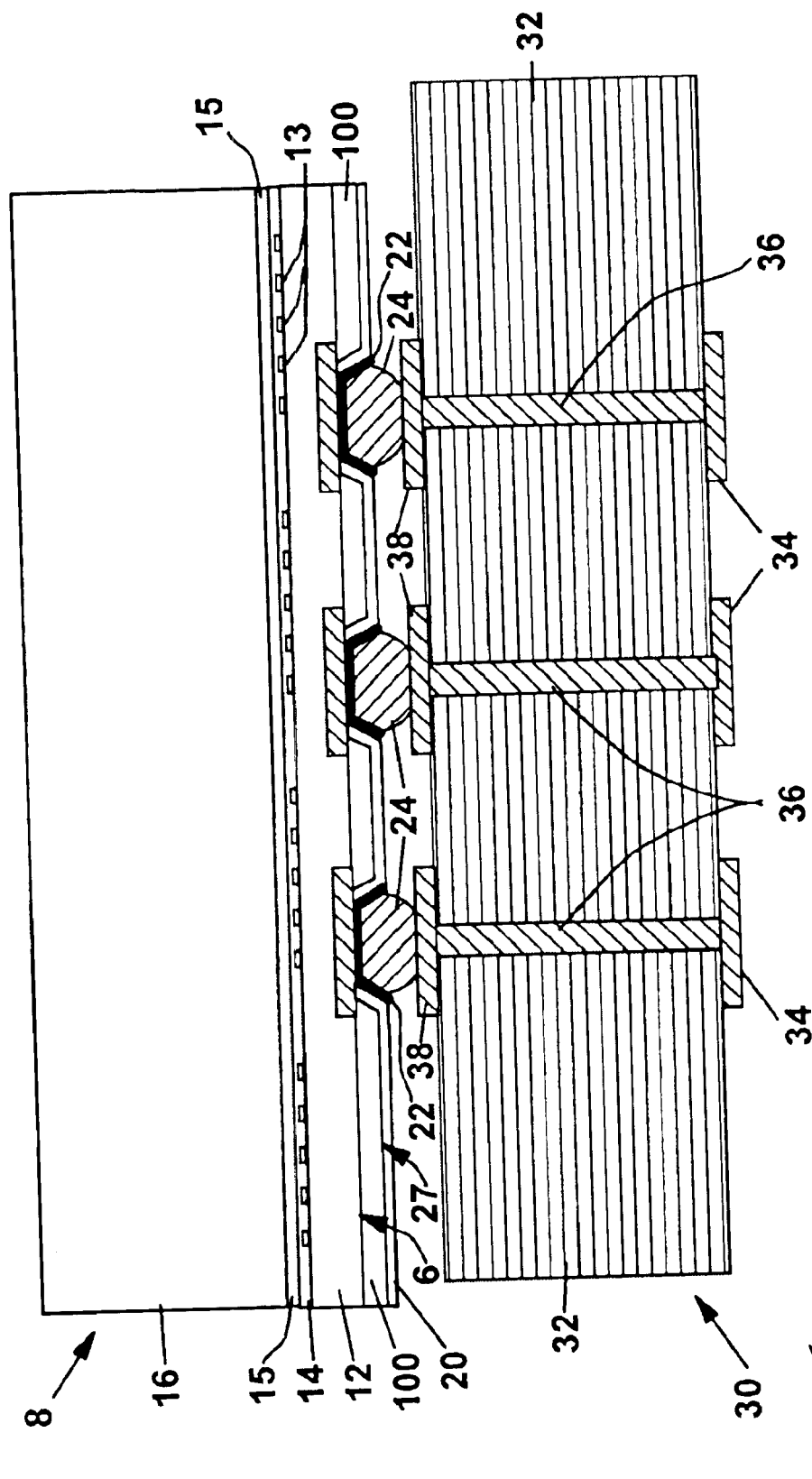

FIG. 2K shows a combined package 40 comprising the SBP 8 of FIG. 2I which has been reinverted with the temporary, transparent, glass wafer holder 16 on the top and the micro-BGAs 24 on the bottom. The micro-BGAs 24 are bonded to the BGA pads 38 on the top of the ceramic carrier 30 of FIG. 2J.

Figure 2L:
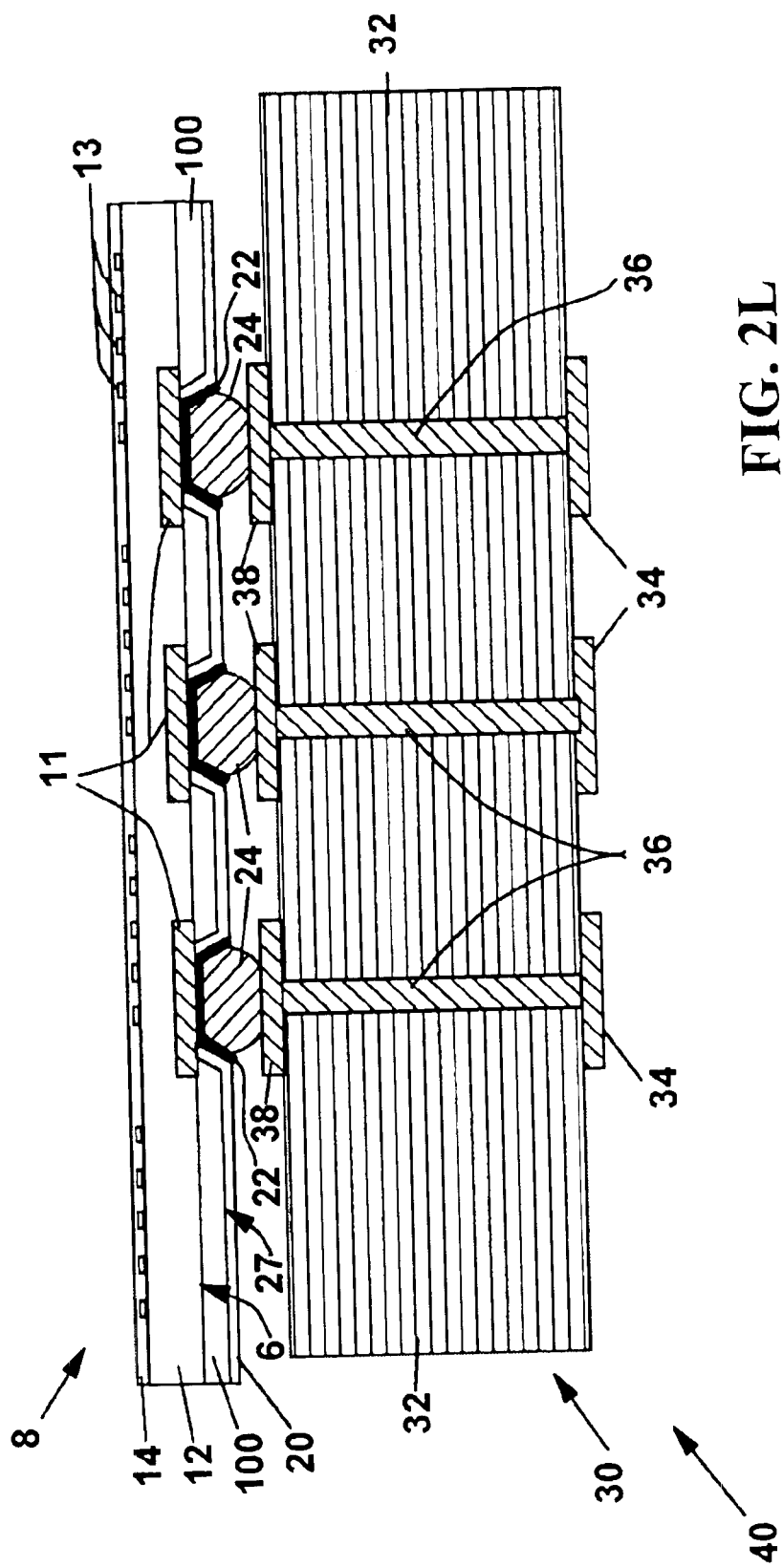

FIG. 2L shows the combined package 40 of FIG. 2K from which the temporary, transparent, glass wafer holder 16 has been released and removed from the surface of the SBP 8 by releasing the releasable adhesive, thin film 15. In the case of a thin film 15 of polyimide, the releasing step can be performed by laser ablation of the polyimide layer with laser radiation through the transparent, temporary, glass wafer holder 16. The step of laser ablation is employed to remove only a few Angstroms of material which is sufficient to achieve the release of the transparent, temporary, glass wafer holder 16.

Next, the thin overcoat 14 (e.g. polyimide film 14) is patterned to form openings in the overcoat 14 to expose the top surfaces of the C4 pads 13.

The solder joint pads 13 underneath the polyimide layer 14 have already been formed during the fabrication of the UTSW 100. BEOL processes can not be used after the diced UTSW 100 is joined to the ceramic carrier 32. The processes such as plating or wet etching of a seed layer would be incompatible with the solder joints 24 on the UTSW. The metallization for solder joining pads 13 can be: Ti/W—Cr/Cu/Au or Cr/Cu/Ni/Au Cr/Cu/Ti/Au, Cr/Cu/Pd/Au etc. The key point is that these metallization layers must be formed on the UTSW 100 prior to the polyimide overcoat layer 14, prior to formation of the solder bumps 24.

Figure 2M:
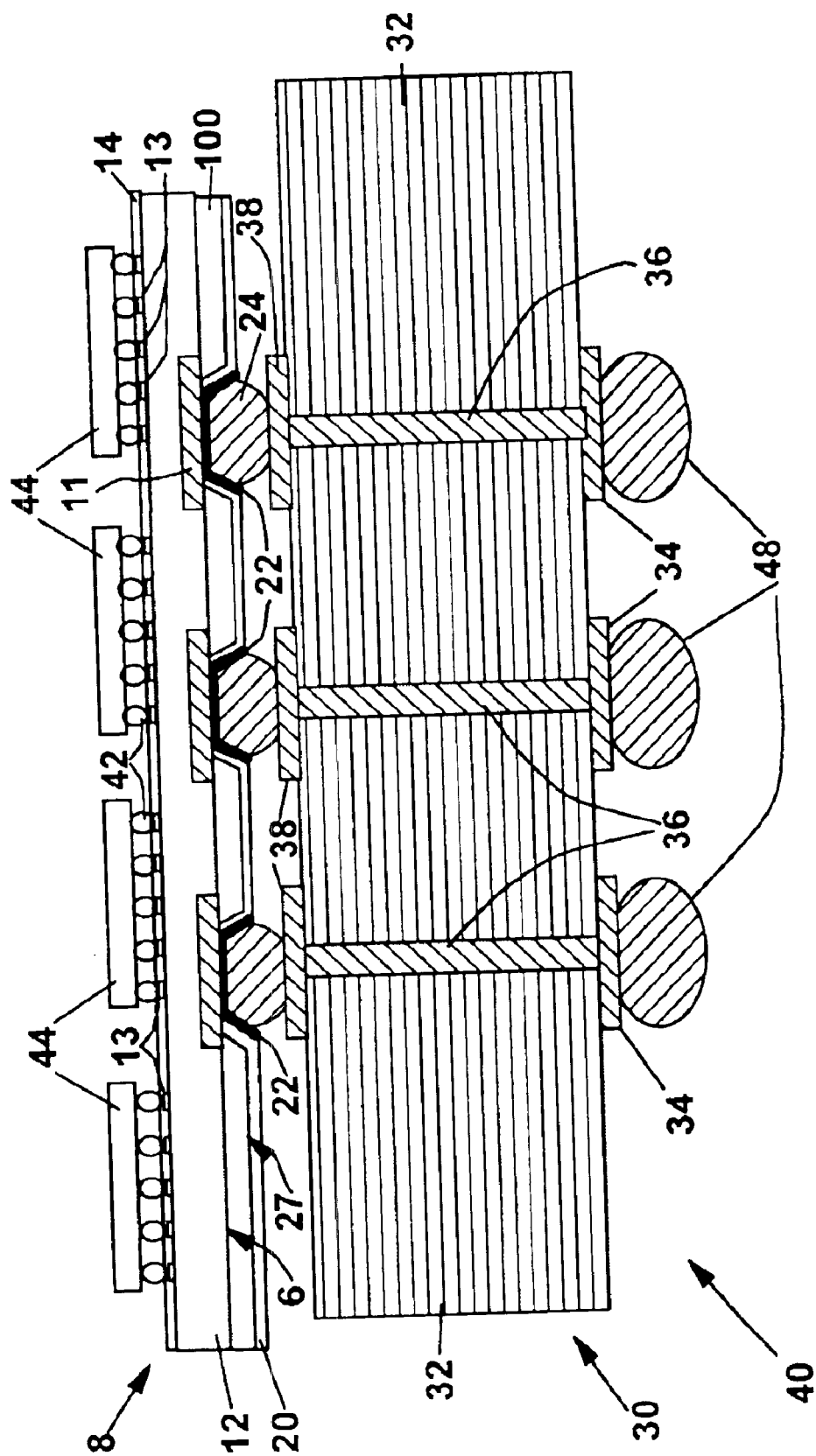

FIG. 2M shows the combined package 40 of FIG. 2L after chips 44 with C4 solder balls 42 have been joined to the SBP 8 by bonding by the array of C4 solder balls 42 to the array of C4 pads 13. After the chips 44 are joined to the SBP 8, the combined package 40 is tested.

If needed, a set of BGAs balls 48 of a BGA array are formed and bonded to the BGA pads 34.

Process Flow 2: Silicon Based Packaging

Figure 3A:
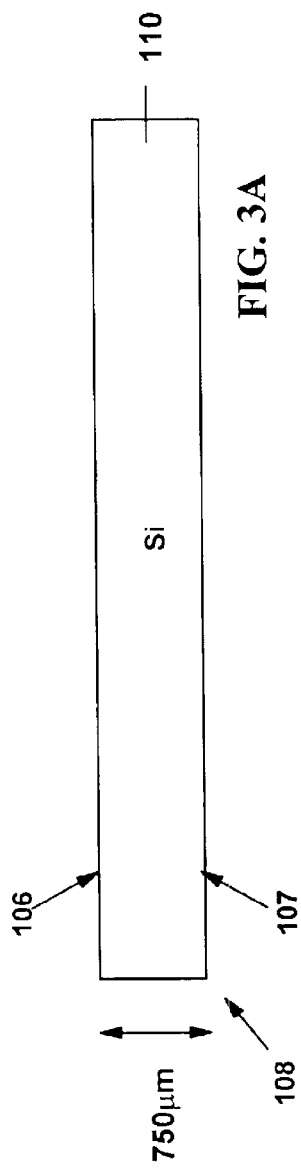

FIG. 3A shows that the first step in the second sequence of process steps, in accordance with this invention. This second embodiment of the invention avoids the use of capture pads in the manufacture of a silicon based package (SBP) 108 because of the automatic self-alignment of the through vias 123' (as described below with reference to FIGS. 3E–3I). Preferably, the SBP 108 initially comprises a silicon wafer 110 with usual parameters e.g. a typical diameter such as 6 inches, 8 inches, or 12 inches (15.24 cm, 20.32 cm, or 30.48 cm) and with a typical thickness such as 750 μm.

Figure 3B:
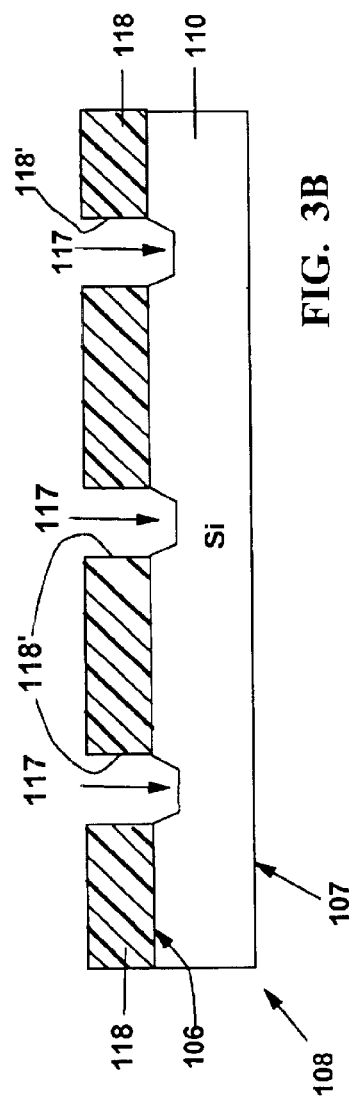

FIG. 3B shows the SBP 108 of FIG. 3A with an array of empty via holes 117 (e.g. 200 μm diameter and spaced 800 μm apart) formed on the top surface 106 of the silicon wafer 110 by the process described below. As an example the via holes 117 are to be etched to a depth of about 80 μm to about 100 μm for a UTSW 200 of FIG. 3H which will have a lesser thickness than the empty via holes 117. For example, after thinning of the silicon wafer 110, when it is converted into the UTSW 200 shown in FIG. 3H, the UTSW 200 will preferably have a thickness of about 50 μm to about 75 μm. In any event, in order to form vias, the empty via holes 117 must be at least slightly deeper than the ultimate thickness of the UTSW 200.

Figure 3C:
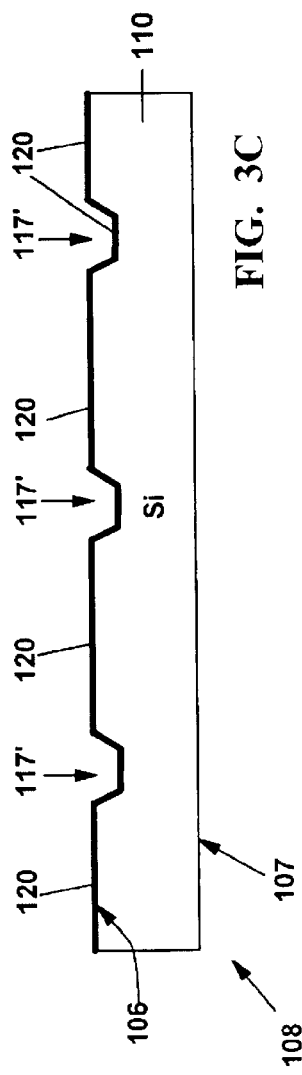
Figure 3I:
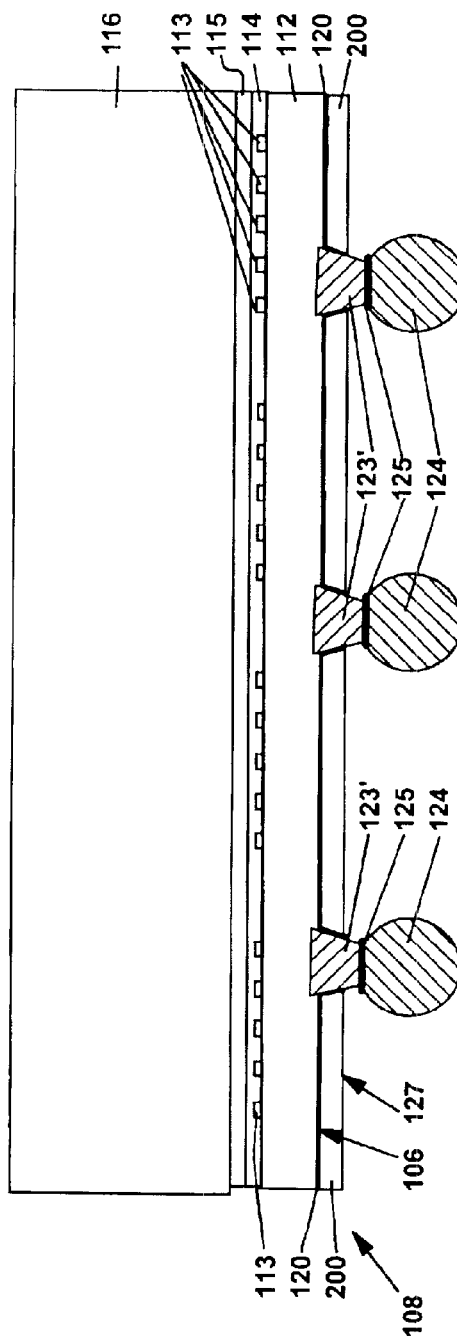

The first step in the process is to cover the top surface 106 of the silicon wafer 110 with a photoresist mask 118 which is patterned to form via windows 118' in a layout which is compatible in its configuration with the configuration of the micro-Ball Grid Array (micro-BGA) of balls 124, which is shown in FIG. 3I. Using the mask 118, the silicon wafer 110 is selectively etched through windows 18' to form an array of empty via holes 117 reaching through the top surface 106 of the silicon wafer 110.

FIG. 3C shows the SBP 108 of FIG. 3A after removal of the mask 118 from the top surface 106 of the silicon wafer 110 followed by a step of oxide growth or oxide deposition of a blanket dielectric thin film layer 120 (e.g. silicon oxide) which covers the top surface 106 of the silicon wafer 110 and the top surfaces of the empty via holes 117 with a thin film to provide isolation of the silicon wafer 110 from subsequent layers to be deposited thereon. The blanket dielectric layer 120 covers all of the remaining portions of the top surface 106 of the silicon wafer 110 and the blanket dielectric layer 120 also cover all surfaces of the empty via holes 117 (leaving partially filled, narrower via holes 117'). Preferably, the dielectric layer 120 is composed of silicon dioxide deposited by PECVD (Plasma Enhanced Chemical Vapor Deposition) or thermal oxide.

FIG. 3D shows the SBP 108 of FIG. 3C after deposition of a thick blanket metal via/cap layer 123 covering all surfaces of the blanket dielectric layer 120 and filling the narrower via holes 117'. The metallurgy of the blanket metal via/cap layer 123 is selected to be compatible with a micro-BGA array.

FIG. 3E shows the SBP 108 of FIG. 3D after forming an array of separate metal vias 123' from the via/cap layer 123 which has been planarized (i.e. removed) down to the top surface of the dielectric layer 120 by polishing/planarizing the via/cap layer 123 leaving the blanket dielectric layer with the partially filled, narrower via holes 117' filled with the remainder of the metal layer 123 thereby forming an array of metal vias 123' which comprise electrical conductors.

FIG. 3F shows the SBP 108 of FIG. 3E after formation of a standard silicon (Si) BEOL (Back End Of the Line) multilayer wiring structure 112. The BEOL structure 112 comprises a multilevel dielectric and interconnection structure formed over the top surface of the SBP 108 covering the vias 123' and covering exposed portions of the dielectric layer 120. The BEOL structure 112 is of the kind well known to those skilled in the art, which provides electrical signal and power line interconnections (not shown for convenience of illustration) within the ultimate packaging structure shown in FIG. 3M to connect to the C4's 142 and the chips 144 and any other devices supported on the SBP 108.

An array of C4 pads 113 (which connect to wiring in the BEOL structure 112) are formed above the standard silicon multi-level BEOL structure 112. The C4 pads 113 can be used to perform an electrical test for opens/shorts of all chip-to-chip nets (wiring).

Then, after the electrical testing step, the top surface of the SBP 108, including the C4 pads 113 and the BEOL structure 112, is coated, as shown in FIG. 3F with a thin overcoat layer 114. The overcoat layer 114 is preferably composed of polyimide to protect the structure during the intermediate steps of the process.

FIG. 3G shows the SBP 108 of FIG. 3F which has been joined to a temporary, transparent, glass wafer holder 116 using a thin film 115 of a releasable adhesive bonded to the thin overcoat layer 114. The provision of the temporary, transparent, glass wafer holder 116 permits the normal handling of the SBP 108 instead of the extraordinary techniques that would be required if a fragile ultra-thin wafer 200 of FIG. 3H (in place of the silicon wafer 110 of FIG. 3G) were to be handled without a temporary, transparent, glass wafer holder 116.

FIG. 3H shows the SBP 108 of FIG. 3G after the silicon wafer 110 has been thinned to form another form of an Ultra-Thin Silicon Wafer (UTSW) 200 on the bottom of the SBP 108 exposing portion of the dielectric layer 120 and the lower portion of the metal vias 123' at the bottoms of via holes 117. The silicon wafer 110 of FIG. 3B has been thinned to the desired/appropriate thickness by a subtractive process such as Chemical Mechanical Planarization/Polishing (CMP) processing or alternative plasma processing or the like to form the UTSW 200. The UTSW 200 has a thickness of about 50 $\mu$m–75 $\mu$m which has been reduced from the thickness of the silicon wafer 10 which would conventionally be about 750 $\mu$m. Because the silicon wafer 10 was temporarily bonded/joined to the temporary, transparent, glass wafer holder 116, it is unnecessary to handle the UTSW 200/BEOL structure 112/and C4 pads 113, etc. as a separate structure. Thus the probability of damaging the thin UTSW 200 is minimized because of the structural support provided by the temporary, transparent, glass wafer holder 116.

By thinning the silicon wafer 110, a set of reasonable diameter metal vias 123' coated with the dielectric 120 can be exposed with conventional etching techniques without excessively weakening the UTSW 200.

Since the metal vias 123' and dielectric layer 120 are deeper than the thickness of the UTSW 200, the metal vias 123' and the layer 120 project below the UTSW 200. Next, exposed portions of the dielectric layer 120 are removed by RIE or the like.

FIG. 3I shows the SBP 108 of FIG. 3H after removal of the exposed portion of the layer 120 from the portion of the metal vias 123' below the UTSW 200 followed by attachment of micro-BGAs 124 to metal layers 125 on the bottom of the vias 123' of the SBP 108 in the conventional manner.

Figure 3J:
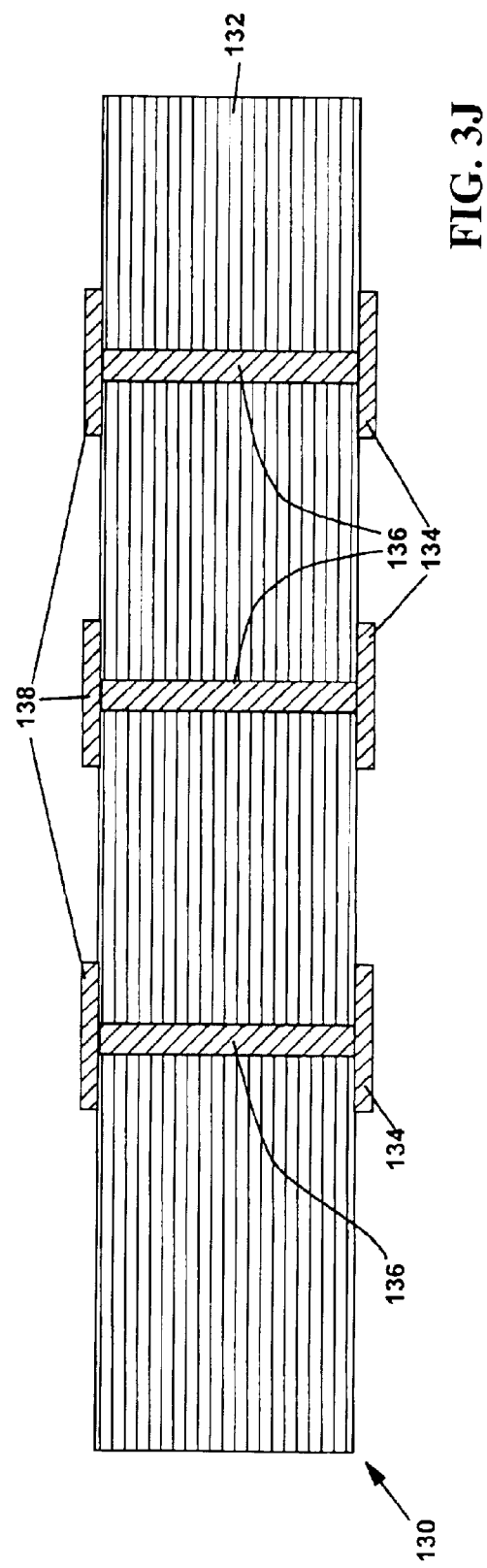

FIG. 3J shows a multilayer ceramic carrier 130 which has been built with a carrier body 132. There is number of conductive, carrier vias 136, a few of which are shown for purposes of illustration which can extend from the top to the bottom through the carrier body 132 or which can connected to intermediate layers as will be well understood by those skilled in the art as described in connection with FIG. 2J. The carrier vias 136 extend between a set of conductive BGA Grid Array (BGA) pads 138 (comprising a portion of the Top Surface Metallurgy (TSM) formed on the top surface of the carrier body 132) and bottom (BGA) pads 134 (comprising a portion of the Bottom Surface Metallurgy (BSM) formed on the lower surface of the carrier body 132).

At this point, if it is required, the structure of the SBP 108 is diced to form individual wiring structures from the multiplicity of structures formed on the temporary, transparent, glass, wafer holder 116, as will be well understood by those skilled in the art.

Figure 3K:
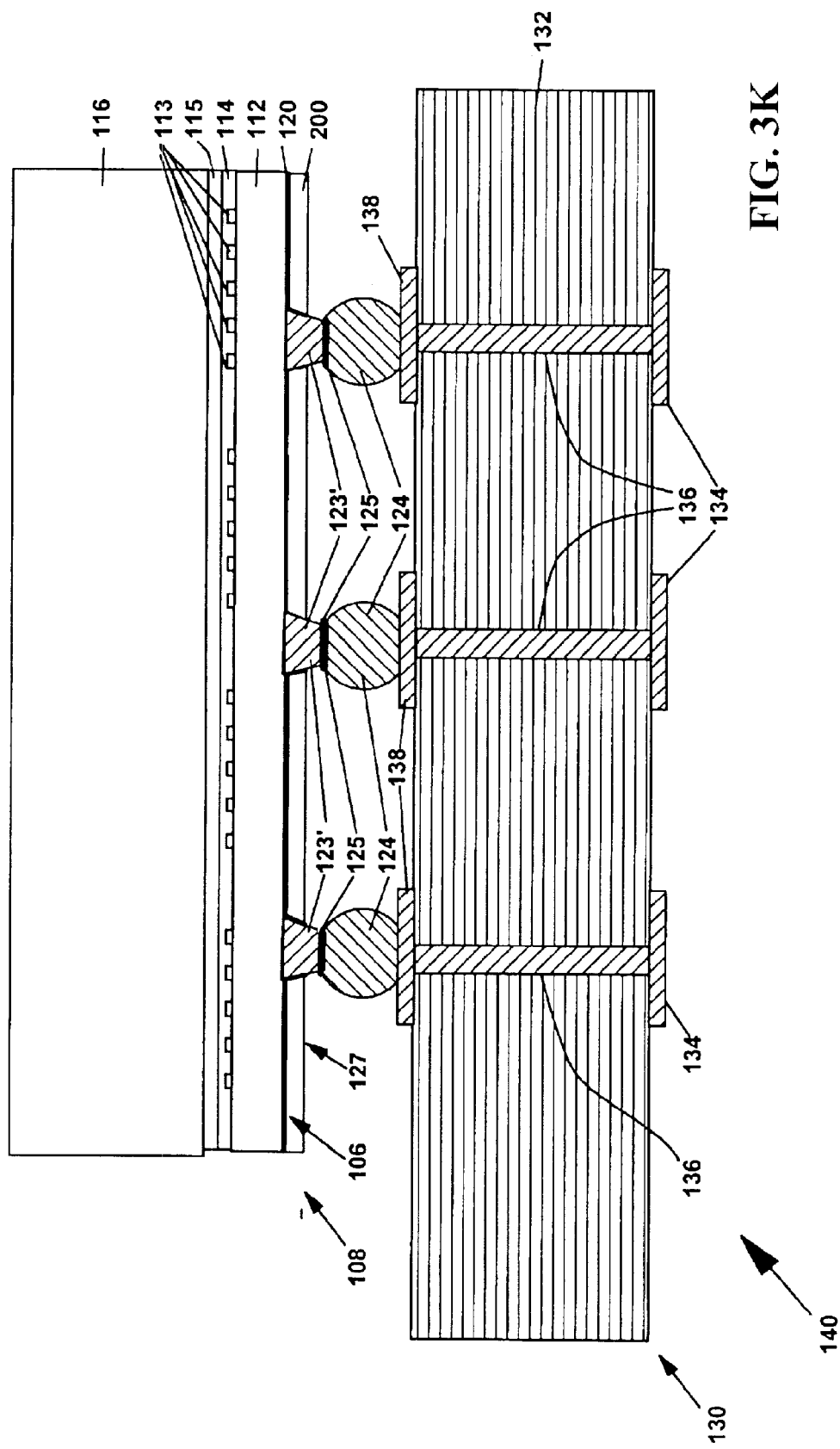

FIG. 3K shows a combined package 140 comprising the SBP 108 of FIG. 3I which has been joined to the ceramic carrier 130 by bonding the micro-BGAs 124 to the BGA pads 138 on the top of the ceramic carrier 130 of FIG. 3J.

Figure 3L:
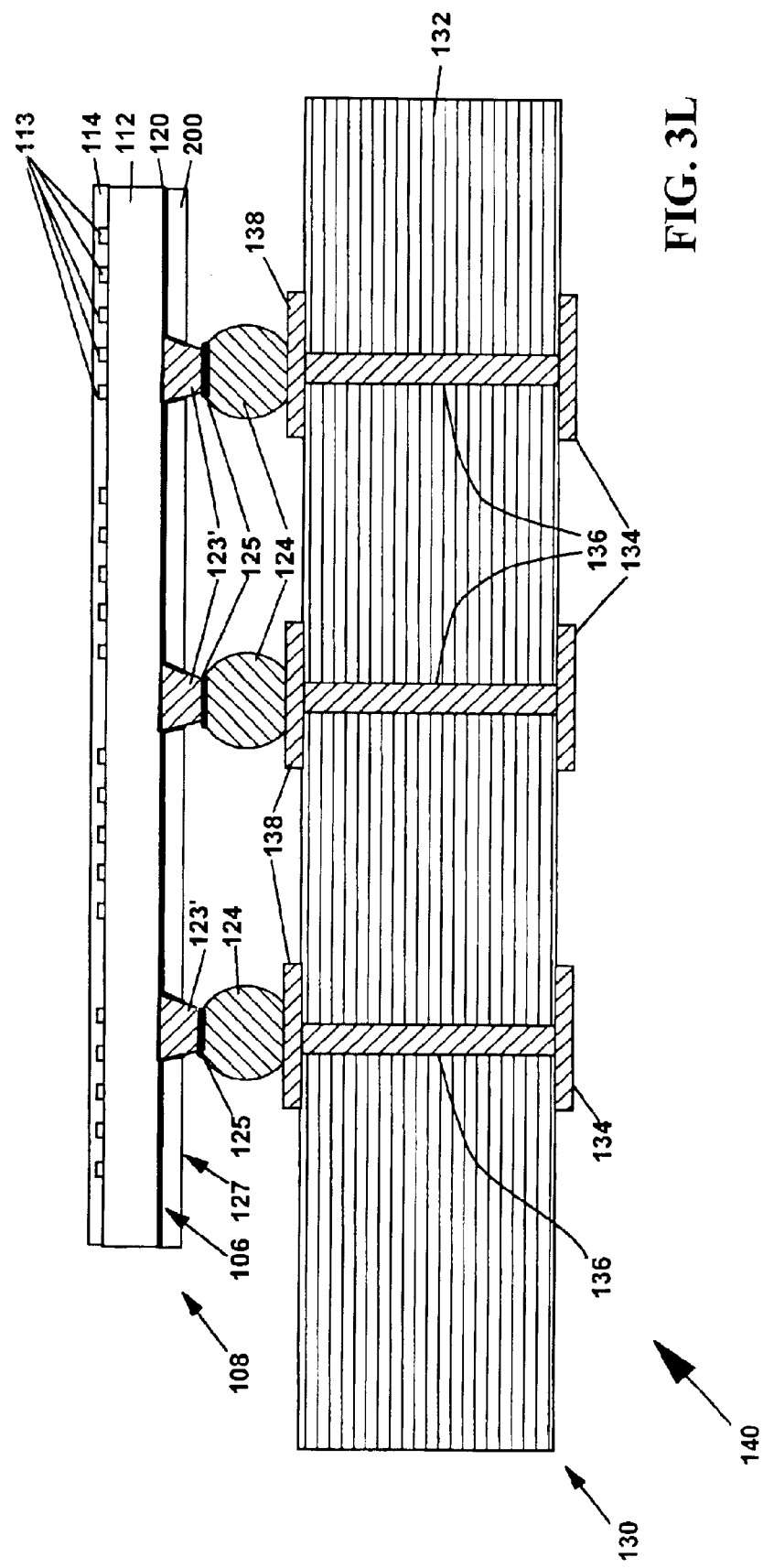

FIG. 3L shows the combined package 140 comprising the SBP 108 of FIG. 3K after removal of the temporary, transparent, glass wafer holder 116 by releasing the releasable thin film 115. In the case of a thin film 15 of polyimide, the releasing step can be performed by laser ablation of the polyimide layer by exposure of the polyimide layer through the transparent temporary, glass wafer holder 116. The step of laser ablation transmits laser radiation through glass wafer holder 116 thereby removing only a few Angstroms of material, which is sufficient to achieve the release of the transparent, temporary, glass wafer holder 116 from the SBP 108.

Next, the thin overcoat 114 (e.g. polyimide film 114) is patterned to form openings in the overcoat 114 to expose the C4 pads 113.

Figure 3M:
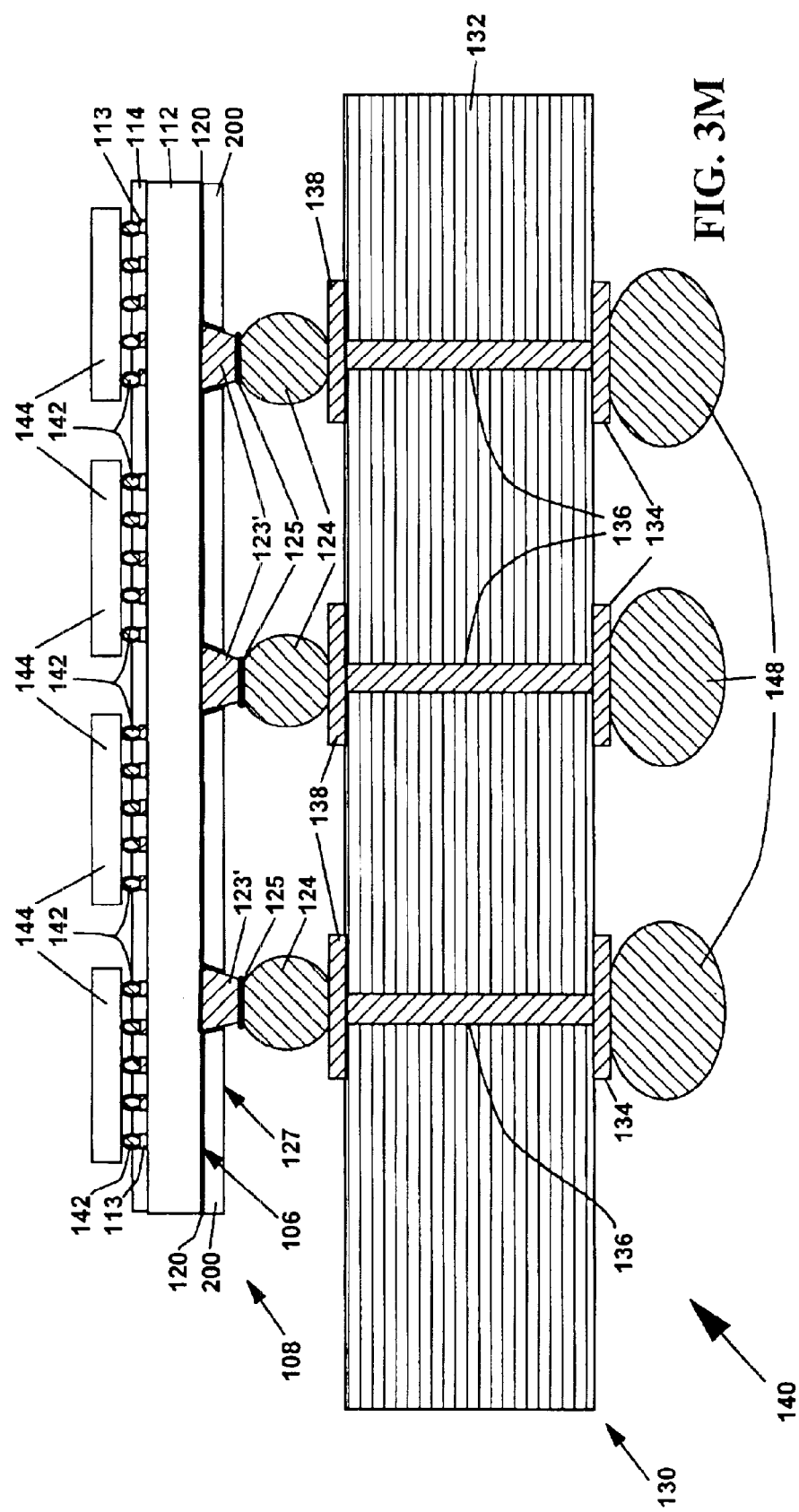

FIG. 3M shows the combined package 140 of FIG. 3L after chips 144 have been bonded by the C4 solder balls 142 to the SBP 108.

After the chips 144 are joined to the SBP 108, the combined package 140 is tested.

If needed, a set of BGAs balls 148 of a BGA array are formed and bonded to the BGA pads 134.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method for fabricating a silicon based package (SBP) in the sequence as follows:
   starting with a wafer composed of silicon and having a first surface and a reverse surface which are planar as the base for the SBP,
   then forming an interconnection structure including multilayer conductor patterns over the first surface;
   then forming a protective overcoat layer over the interconnection structure;
   then forming a temporary bond between the protective overcoat layer of the SBP and a wafer holder, with the wafer holder being a rigid structure;
   then thinning the reverse surface of the wafer to a desired thickness to form an ultra thin silicon wafer (UTSW) for the SBP;
   then forming via holes which extend through the UTSW;
   then forming metallization in the via holes with the metallization extending through the UTSW; and
   then removing the temporary bond.

2. The method of claim 1 including bonding the metallization in the via holes to pads of a carrier.

3. The method of claim 1 including forming capture pads on the first surface prior to thinning the wafer.

4. The method of claim 1 including:
   initially forming capture pads on the first surface;
   then forming the interconnection structure over the first surface and the capture pads;
   then forming the temporary bond of the wafer holder to the reverse surface; and
   then thinning the wafer, thereby forming the UTSW.

5. The method or claim 1 including:
   initially forming capture pads on the first surface;
   then forming interconnection structure over the first surface and the capture pads;
   then forming the temporary bond of the wafer holder to the reverse surface,
   then thinning the wafer, thereby forming the UTSW; and
   then forming the via holes through the UTSW down to the capture pads.

6. The method of claim 1 including:
   initially forming capture pads on the first surface;
   then forming interconnection structure over the first surface and the capture pads,
   then forming the temporary bond of the wafer holder to the reverse surface,
   then thinning the wafer, thereby forming the UTSW;
   then forming the via holes through the UTSW down to the capture pads;
   then forming a dielectric layer over the surface of the wafer leaving the bottoms of the via holes clear with the capture pads exposed; and
   then forming the metallization in the via holes in contact with the capture pads.

7. The method of claim 1 including:
   initially forming capture pads on the first surface;
   then forming interconnection structure over the first surface and the capture pads
   then forming the temporary bond of the wafer holder to the reverse surface;
   then thinning the wafer, thereby forming the UTSW;
   then forming the via holes through the UTSW down to the capture pads;
   then forming a dielectric layer over the surface of the wafer leaving the bottoms of the via holes clear with the capture pads exposed;
   then depositing metal pads into the via holes in contact with the capture pads; and
   then forming metal joining structures on the metal pads.

8. The method of claim 1 including initially forming via holes in the first surface prior to thinning the wafer.

9. The method of claim 1 including the steps as follows:
   Initially forming via holes in the first surface prior to thinning the wafer;
   then forming a dielectric layer covering the via holes.

10. The method of claim 1 including the steps as follows:
    initially forming via holes in the first surface prior to thinning the wafer;
    then forming a dielectric layer over die surface of the wafer including the via holes; and
    then forming a through via/cap pad layer of a first metal layer over dielectric layer including the via holes.

11. The method of claim 1 including the steps as follows:
    initially forming via holes in the first surface prior to thinning the wafer;
    then forming a dielectric layer over the surface of the wafer including the via holes,
    then forming a through via/cap pad layer of a first metal layer over dielectric layer including the via holes; and
    then planarizing to remove the via/cap pad layer above the surface of the dielectric layer, thereby forming vias in the via holes.

12. The method of claim 1 including the steps as follows:
    initially forming via holes in the first surface prior to thinning the wafers;
    then forming a dielectric layer over the surface of the wafer including the via holes,
    then forming a through via/cap pad layer of a first metal layer over dielectric layer including the via holes;
    then planarizing to remove the via/cap pad layer above the surface of the dielectric layer, thereby forming vias in the via holes; and then forming an interconnection structure over the first surface including the first metal layer.

13. The method of claim 1 including the steps as follows:

initially forming via holes in the first surface prior to thinning the wafer;

then forming a dielectric layer over the surface of the wafer including the via holes, then forming a through via/cap pad layer of a first metal layer over dielectric layer including the via holes;

then planarizing to remove the via/cap pad layer above the surface of the dielectric layer, thereby forming vias in the via holes;

then forming interconnection structure over the first surface including the metal vias and the first metal layer;

then forming the temporary bond to the rigid wafer holder on the reverse surface; and then thinning the wafer to the desired thickness of the UTSW.

14. The method of claim 1 including the UTSW having a desired thickness including as follows:

the step of forming the temporary bond between the protective overcoat layer of the SBP and the wafer holder leaving the reverse surface exposed;

the via holes extending through the thickness of the UTSW; and the metallization in the via holes extending through the thickness of the UTSW.

15. A method for fabricating a Silicon Based Package (SBP) in the sequence as follows:

starting with a wafer composed of silicon and having a first surface and a reverse surface which are planar as the base for the SBP;

then forming an interconnection structure including multilayer conductor patterns over the first surface;

then forming a protective overcoat layer composed of polyimide over the interconnection structure;

then forming a temporary bond between the protective overcoat layer of the SBP and a wafer holder, with the wafer holder being a rigid structures;

then thinning the reverse surface of the wafer to a desired thickness to form an Ultra Thin Silicon Wafer (UTSW) for (he SBP;

then forming via holes which extend through the UTSW;

then forming metallization in the via holes with the metallization extending through the UTSW; and then removing the temporary bond.

16. The method of claim 15 including:

forming the temporary bond with polyimide; and releasing the temporary bond by laser ablation.

* * * * *